United States Patent
Broutin et al.

(10) Patent No.: US 6,272,157 B1
(45) Date of Patent: *Aug. 7, 2001

(54) APPARATUS AND METHOD FOR CALIBRATING A WAVELENGTH STABILIZED LASER

(75) Inventors: Scott L. Broutin, Kutztown; James Kevin Plourde, Allentown; George John Przybylek, Douglasville; John William Stayt, Jr., Schnecksville; Frank Stephen Walters, Kutztown, all of PA (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/228,887

(22) Filed: Jan. 11, 1999

(51) Int. Cl.[7] .......................................................... H10S 3/13
(52) U.S. Cl. ................................ 372/32; 372/31; 372/34; 372/103; 372/20; 372/28; 372/101; 372/29; 372/27; 372/9
(58) Field of Search ................................. 372/32, 31, 29, 372/34, 103, 20, 28, 101, 27, 9; 250/559.1, 250, 216, 227.23

(56) References Cited

U.S. PATENT DOCUMENTS

| | | |
|---|---|---|
| 4,901,306 | 2/1990 | Gardner . |
| 4,912,526 | 3/1990 | Iwaoka et al. . |
| 4,914,662 | 4/1990 | Nakatani et al. . |
| 5,084,884 | 1/1992 | Terada . |
| 5,384,799 | 1/1995 | Osterwalder . |
| 5,428,700 | 6/1995 | Hall . |
| 5,764,678 | 6/1998 | Tada . |
| 5,786,915 | 7/1998 | Scobey . |
| 5,832,014 | 11/1998 | Johnson . |

OTHER PUBLICATIONS

Tidrow et al., "A high strain two–stack two–color quantum well infrared photodetector", Appl. Phys. Lett. 70(7):859–861, Feb. 1997.

(List continued on next page.)

Primary Examiner—Robert H. Kim
Assistant Examiner—Delma R. Flores Ruiz
(74) Attorney, Agent, or Firm—Duane Morris & Heckscher LLP; Steven E. Koffs

(57) ABSTRACT

A wavelength stabilized laser system includes a laser that produces a laser light having an amplitude and a wavelength that varies as a function of a temperature of the laser. A temperature control device controls the temperature of the laser. A beam splitter deflects a portion of the laser light. A first detector receives the portion of the laser light from the beam splitter and provides a first signal representing the amplitude of the laser light. A filter has a gain that is a function of the wavelength of the laser light. The filter receives the laser light and outputs a filtered light having an amplitude that varies with the wavelength of the laser light. A second detector provides a second signal representing the amplitude of the filtered light. A sealed housing contains the laser, the first and second detectors and the filter. The housing has a window. An electromagnetic radiation source outside of the housing transmits a calibration beam through the window and through the filter, onto the second detector. One or more processors control the temperature control device based on the first and second signals, and monitor a light transmitting characteristic of the filter based on the second signal.

19 Claims, 3 Drawing Sheets

OTHER PUBLICATIONS

Chen et al., "Two–color corrugated quantum–well infrared photodetector for remote temperature sensing", Appl. Phys. Lett. 72(1):7–9, Jan. 1998.

1998 Santec Component Series, pp. 1–11.

Wavelength–Selected (D2526G) Laser 2000 Direct Modulated Isolated DFB Laser Module, Lucent Technologies, Bell Labs Innovations, Aug. 1997, pp. 1–8.

Wavelength Locker Test Report, JDS Fitel, Dec. 4, 1997, pp. 1–3.

Nortel Networks: Optical Networking/Transport, Nov. 18, 1998, pp. 1–3.

Broadband: Product Portfolio—Utility Networks, Nortel, Nov. 18, 1998, pp. 1–2.

News Letter, 32ch Tunable Laser Light Source System, Nov. 18, 1998, p. 1.

News Letters, Optical Variable Attenuator, OVA–630, Nov. 18, 1998, p. 1.

Components for DWDM Systems, Santec, Laser Focus World, Oct. 1998, p. 70.

APPARATUS AND METHOD FOR CALIBRATING A WAVELENGTH STABILIZED LASER

FIELD OF THE INVENTION

The present invention is related to the field of wavelength stabilized laser systems.

DESCRIPTION OF THE RELATED ART

The wavelength stabilized laser is a recently developed component of dense wavelength division multiplexed (DWDM) systems. In a DWDM system, a single semiconductor laser device may be used to provide light at several predetermined wavelengths (each corresponding to a different channel.) Commercial devices have been produced with 100 gigahertz spacing. If it becomes necessary to add further channels to an existing optical fiber, even denser wavelength spacing may be used in the future. As the wavelength spacing decreases, wavelength stabilization takes on a more important role.

U.S. Pat. No. 5,832,014 to Johnson, which is assigned to Lucent Technologies Inc., is incorporated herein by reference in its entirety for its teachings on wavelength stabilization in tunable semiconductor lasers. Johnson describes a tunable semiconductor laser including a gain section and at least one tuning section. Spontaneous emission (SE) from the tuning section is detected and used in a feedback control loop to control the amount of current applied to the tuning section. The feedback control loop operates to maintain the detected SE at a constant level, such that the current applied to the tuning section is adjusted to compensate for the effects of aging and the laser output wavelength is thereby stabilized.

Johnson rejects a number of alternative approaches, stating that, "Conventional approaches to solving the wavelength stabilization problem in tunable semiconductor lasers generally involve monitoring the lasing wavelength using precise filters . . . . However, these filtering techniques can be expensive and difficult to implement in many practical applications. Moreover, the required filters are often unsuitable for integration with the semiconductor laser on a single chip."

A method and apparatus are desired that makes use of filters for wavelength stabilization in semiconductor lasers practical and effective.

SUMMARY OF THE INVENTION

The present invention is a calibration apparatus and method in which a window is provided in the laser housing, and an electromagnetic radiation source outside of the housing transmits a calibration beam through the window and through the filter, onto a detector.

The calibration apparatus includes a first detector that monitors an amplitude of a laser light output by the laser. A filter receives the laser light and outputs a filtered light having an amplitude that varies with the wavelength of the laser light. A second detector monitors the amplitude of the filtered light. A sealed housing contains the first and second detectors and the filter. The housing has a window. An electromagnetic radiation source outside of the housing transmits a calibration beam through the window and through the filter, onto the second detector.

DETAILED DESCRIPTION

Figure 1A:
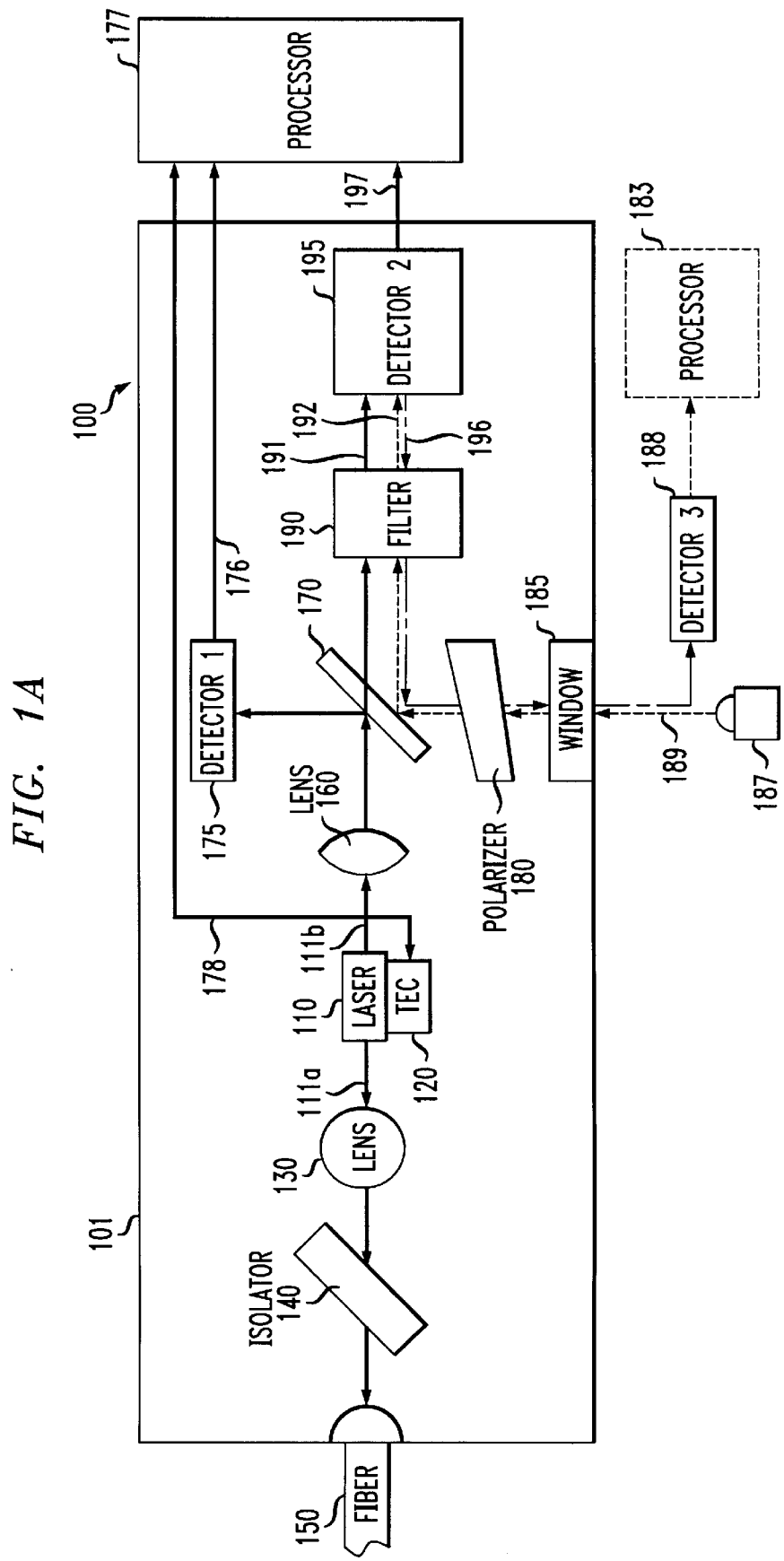
FIG. 1A is a block diagram of a first exemplary embodiment of the invention.

FIG. 1A is a block diagram of a laser system 100 including a first exemplary embodiment of the invention. The wavelength stabilized laser system 100 includes a laser 110 that transmits a laser light 111a from the front and a laser light 111b from the backface of laser 110. The laser light 111a is transmitted through a focusing lens 130 and optical isolator 140, to an optical fiber 150. The isolator 140 prevents transmission of light back from the fiber 150 into the laser 110. Isolator 140 may be a conventional isolator providing at least about 30 dB of attenuation. The laser lights 111a and 111b have the same wavelength, so that the properties of laser light 111a are determined and controlled by monitoring light 111b.

To monitor the wavelength of laser light 111b, laser system 100 uses a filter 190, that receives the laser light and outputs a filtered light 191 having an amplitude that varies with the wavelength of the laser light 111b. More specifically, the filter 190 has a gain that is a function of the wavelength of the laser light 111b. The filter may be, for example, a conventional etalon or an edge of crossing filter, band pass filter, low pass filter, high pass filter, or the like.

The filtered light 191 is used to provide feedback that is used to stabilize the frequency of the laser light 111b. More specifically, because the amplitude of the filtered light 191 is a function of the amplitude and wavelength of the laser light 111b, the ratio of the amplitude of the filtered light 191 to the amplitude of the laser light 111b depends on the wavelength. By monitoring the ratio, the wavelength may generally be determined. For some types of filters, a given ratio can only correspond to a single wavelength within the working range of the laser. For other types of filters (e.g., an etalon) several wavelengths may result in the same ratio; other known data may be used to determine which of these wavelengths produced that ratio.

For example, if an etalon is used, and the temperature of the laser is monitored, the wavelength may be approximated based on the temperature, and the actual wavelength is the wavelength which: (1) produces the observed ratio, and (2) lies nearest to the approximated wavelength.

Conventional systems using filters to monitor laser wavelength, operate on the assumption that the filter is immune to aging and drift effects. This assumption may be incorrect. If the filter is subject to aging or drift effects, the ratio of the filtered light 191 to the laser light 111b at any given frequency may deviate from the ratio for the same frequency at the time assembly 100 is manufactured. For example, it is possible that the filter may darken, or the transfer function of the filter may change after long periods of exposure to laser light. Further, the position or tilt of the filter may shift within the package (e.g., due to solder creep). A very small change in the orientation of the filter may have a substantial effect on the transfer function of the filter.

According to the present invention, a method and an apparatus are provided for monitoring the characteristics of the filter 190. A window 185 is provided in the laser housing 101, and an electromagnetic radiation source 187 outside of the housing 101 transmits a calibration beam 189 through the window 185 and through the filter 190, to form a filtered calibration beam 192 that reaches a detector 195. Because a known, calibrated radiation source 187 may be used for calibrating filter 190, instead of the laser light 111b, a change in the filtered calibration beam 192 is not confounded with a change in the laser light 111b.

Referring again to FIG. 1A, the complete calibration system is described in greater detail below. Laser light 111b has an amplitude and a wavelength that varies as a function of the temperature of the laser 110.

The laser 100 may be a of a conventional type, such as a distributed feedback (DFB) laser, or a distributed Brag reflector (DBR) laser, or the like. The wavelength of the laser light 111b generated by these laser types is a function of the temperature of the laser 100. (The wavelength of a DBR laser is a function of both the temperature and a bias signal that is provided to the Brag reflector section of the DBR laser.) Thus, temperature adjustments may be used to adjust the wavelength of either a DFB or DBR laser.

Figure 2:
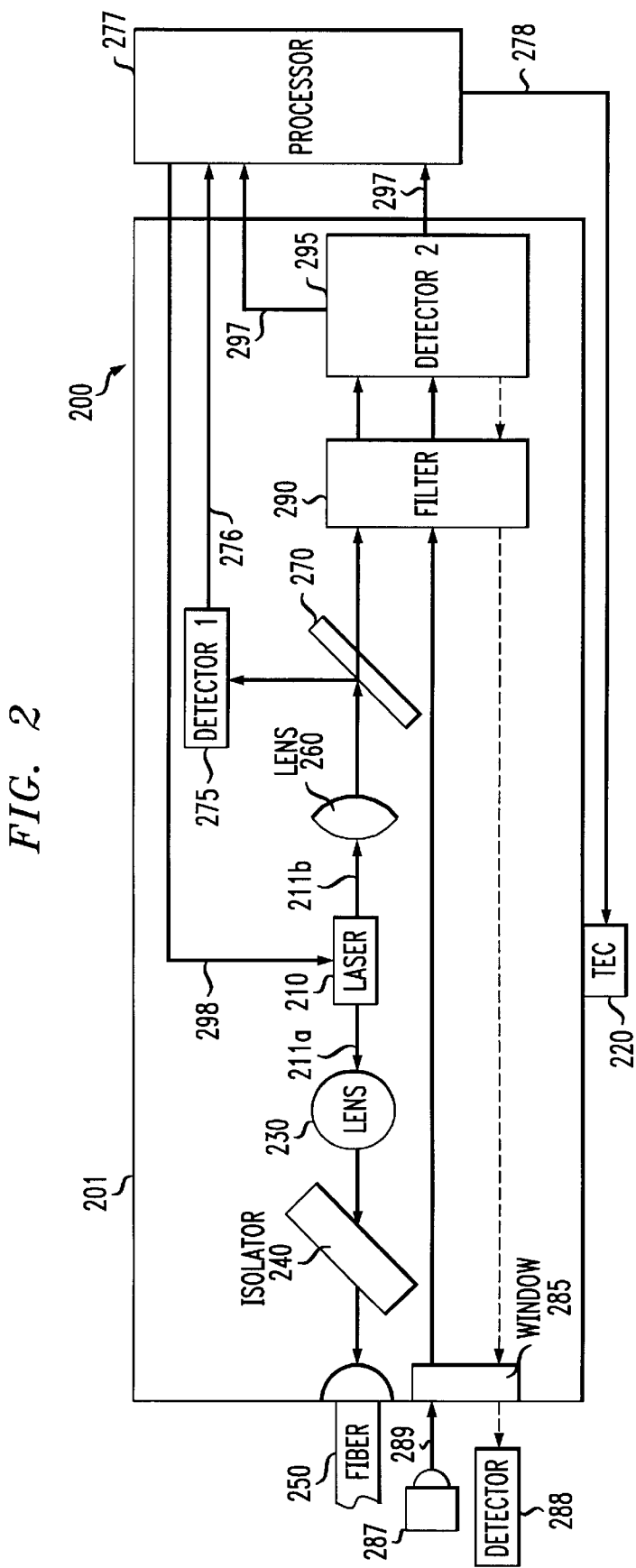
FIG. 2 is a block diagram of a second exemplary embodiment of the invention.

In the exemplary embodiments, temperature control device (which may be, for example, a thermoelectric cooler (TEC) 120), is thermally coupled to the laser 110 to control the temperature of the laser. The TEC 120 may be adjacent to the laser, as shown in FIG. 1A, or may be mounted outside of the housing 101 (as shown in FIG. 2). Because the entire package may be quite small, it is possible to have a high thermal conductance between the laser 110 and the TEC 120, even if the TEC 120 is not abutting the laser 110. The TEC allows heating and cooling of the laser 110. Alternative heating devices may include a resistance heater (not shown).

A focussing lens 160 focuses the laser light 111b. A beam splitter 170 deflects a portion of the laser light 111b onto a first detector 175. Detector 175 may be, for example, a conventional P-I-N (positive-intrinsic-negative) diode, which may be, for example, an InGaAs, InP, or InAs type diode. Other suitable photodetectors may be used. The first detector 175 receives the portion of the laser light 111b from the beam splitter 170 and provides a first signal 176 representing the amplitude of the laser light 111b. The beamsplitter 170 has a back surface that reflects substantially all of the calibration beam 189.

The remainder of the laser light 111b that is not deflected by beamsplitter 170 is transmitted through beamsplitter 170 and filter 190. A second detector 195, which may also be a P-I-N diode, provides a second signal 197 representing the amplitude of the filtered light 191. As described above, during normal operation of the laser 110, the ratio of amplitude of the filtered light 191 to the amplitude of the laser light 111b is determined based on the output signals 176 and 197 of the two diodes 175 and 195, respectively. FIG. 1A shows a processor 177 which receives the first and second electrical signals 176 and 197 of the respective detectors 175 and 195. One of ordinary skill in the art understands that the electrical output signals 176 and 197 may be electrically filtered and amplified, and may be converted from analog to digital format, before being processed by processor 177.

Processor 177 may be a microprocessor or microcontroller, an application specific integrated circuit (ASIC) or may be the processor of a general purpose computer. Processor 177 feeds back a control signal 178 to the TEC 120, and in the case of a DBR laser, may also adjust the bias signal provided to the laser, based on the signals 176 and 197. The assembly 100 includes a hermetically sealed housing 101 containing the laser 110, the first and second detectors 175, 195, the lens 160 and the filter 190. According to the invention, the housing has a window 185. Window 185 allows an external optical source 187 (or other electromagnetic radiation source, such as infra-red source) to inject a calibration beam 189 through the filter 190.

The window 185 is transparent in the frequency band of the calibration beam 189, and may be formed of a material such as quartz or glass, for example. The window 185 may be in the form of a waveguide, a flat optical window, a wedge shaped window, an optical fiber, and a graded index rod.

The characteristics of the filter 190 may be monitored by detecting the amplitude of the filtered calibration beam 192. For example, the system may have a calibration mode, in which the processor 177 is actively monitoring the second detector 195, but the laser 110 does not transmit light 111b. The filter optical characteristics may thus be checked during routine maintenance, without interfering in normal operations of the laser 100. A calibration beam 189 for this purpose may be a laser, or other suitable beam. In this case, the filter calibration data may be processed by the same processor 177 that is used to control the normal operations of the laser 110.

Alternatively, a portion 196 of the calibration beam 192 that is reflected back from detector 195 may be measured by an external detector 188. A polarizer or analyzer 180 may be included within the housing 101. The polarizer makes it easier to separate the reflected light 196 from the calibration beam 189, by virtue of their different polarizations. The external detector 188 provides an output signal that may be processed by processor 177 or by another processor 183. If a second processor 183 is present, it may be, but need not be, the same type of microprocessor, microcontroller, ASIC or general purpose computer as processor 177.

If an external detector 188 is used, the calibration beam 189 may be in a different band from the filtered light 191, or the second detector 195 may have a semi-silvered surface, so that substantially all of the calibration beam 192 is reflected from the second detector 195. Then the reflected calibration beam 196 may be measured by the external detector 188 while the laser 110 is operating, without affecting the measurement of the filtered light 191 in the second detector 195.

Figure 1B:
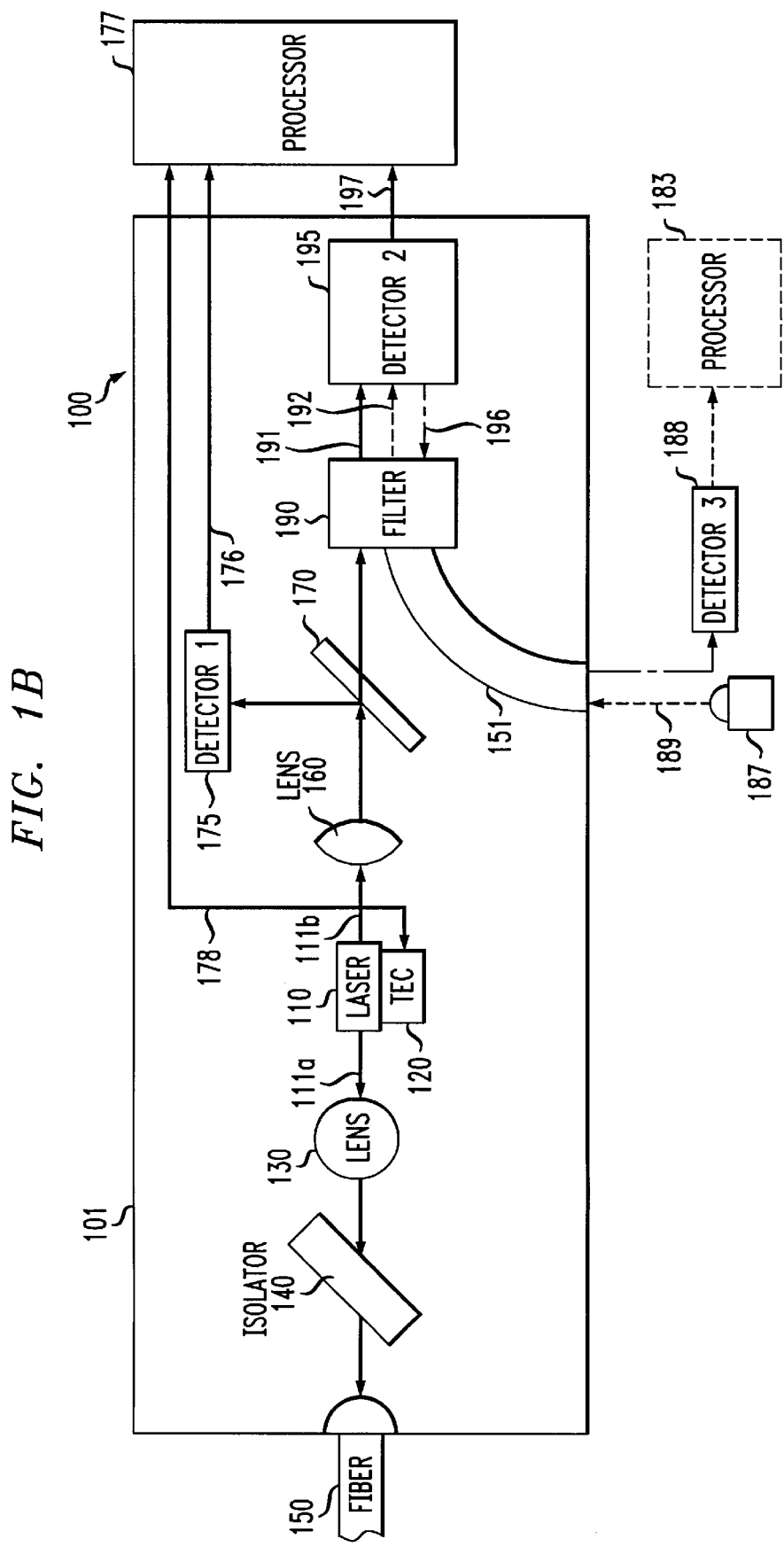
FIG. 1B is a block diagram of a variation of the exemplary embodiment of FIG. 1A.

FIG. 1B shows a variation of the apparatus of FIG. 1A. In FIG. 1B, the window is replaced by an optical fiber 151, and no polarizer is used. Other items in FIG. 1B are the same as shown in FIG. 1A, and are indicated by the same reference numerals.

Based on the measurements of the filtered calibration beam 192 or the reflected beam 196, corrections may be implemented for filter aging or drift. For example, look up tables used by the processor 177 may be updated.

FIG. 2 shows another variation of the first exemplary embodiment. Elements in FIG. 2 that are correspond to elements in FIG. 1 are indicated by reference numerals having the same two least significant digits (e.g., laser 210 in FIG. 2 corresponds to laser 110 in FIG. 1) and a description of each corresponding item is not repeated.

In FIG. 2, the window 285 is located in a different position from that of FIGS. 1A and 1B. This allows the calibration beam 289 to be directed through the filter 290 without using a beam-splitter to deflect the calibration beam. FIG. 2 also shows an additional bias signal 298 that is transmitted to the laser 210, based on the first detector signal 276 and the second detector signal 297. In other respects, the variation of FIG. 2 is the same as that of FIGS. 1A and 1B.

By monitoring the characteristics of the filter 290, one of ordinary skill in the art could readily update the constants used to process the second electrical signal 297 generated by the second detector 295, so that the wavelength of laser light 21 lb is still accurately determined, even if the characteristics of filter 290 change. These changes may be implemented within processor 277.

One of ordinary skill recognizes that a plurality of lasers may be contained within a single sealed housing, and configurations including multiple lasers and multiple calibration apparatus within a single housing are contemplated within the scope of the invention.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A calibration apparatus, comprising:
   a first detector that monitors an amplitude of a laser light output by the laser;
   a filter that receives the laser light and outputs a filtered light having an amplitude that varies with the wavelength of the laser light;
   a second detector that monitors the amplitude of the filtered light;
   a sealed housing containing the first and second detectors and the filter, the housing having a window;
   an electromagnetic radiation source outside of the housing that transmits a calibration beam through the window and through the filter, onto the second detector.

2. The apparatus according to claim 1, wherein the second detector reflects a portion of the calibration beam back through the filter, and back out through the window, the portion of the calibration beam being used to determine a characteristic of the filter.

3. The apparatus according to claim 2, further comprising a polarizer which changes a polarization of the reflected light relative to a polarization of the calibration beam.

4. The apparatus according to claim 1, wherein the window is one of the group consisting of a waveguide, a flat optical window, a wedge shaped window, an optical fiber, and a graded index rod.

5. The apparatus according to claim 1, further comprising a beam splitter that deflects a first portion of the laser light onto the first detector, and transmits a second portion of the laser light to the filter.

6. The apparatus according to claim 1, wherein the filter has a gain that is a function of the wavelength of the laser light.

7. The apparatus according to claim 1, wherein the filter is one of the group consisting of an etalon and an edge of crossing or edges of band pass filters, low pass filters, or high pass filters.

8. The apparatus according to claim 1, further comprising a processor that monitors a light transmitting characteristic of the filter based on the second signal.

9. A wavelength stabilized laser system, comprising:
   a laser that produces a laser light having an amplitude and a wavelength that varies as a function of a temperature of the laser;
   a temperature control device that controls the temperature of the laser;
   a beam splitter that deflects a portion of the laser light;
   a first detector that receives the portion of the laser light from the beam splitter and provides a first signal representing the amplitude of the laser light;
   a filter having a gain that is a function of the wavelength of the laser light, the filter receiving the laser light and outputting a filtered light having an amplitude that varies with the wavelength of the laser light;
   a second detector that provides a second signal representing the amplitude of the filtered light;
   a sealed housing containing the laser, the first and second detectors and the filter, the housing having a window;
   an electromagnetic radiation source outside of the housing that transmits a calibration beam through the window and through the filter, onto the second detector;
   means for controlling the temperature control device based on the first and second signals, and for monitoring a light transmitting characteristic of the filter based on the second signal.

10. The apparatus according to claim 9, further comprising a polarizer which changes a polarization of the reflected light relative to a polarization of the calibration beam.

11. The apparatus according to claim 9, wherein the window is one of the group consisting of a waveguide, a flat optical window, a wedge shaped window, an optical fiber, and a graded index rod.

12. The apparatus according to claim 1, wherein the filter is one of the group consisting of an etalon and an edge of crossing or edges of band pass filters, low pass filters, or high pass filters.

13. A method for calibrating a laser, comprising the steps of:
    monitoring an amplitude of a laser light output by the laser;
    filtering the laser light in a filter, to form a filtered light having an amplitude that varies with the wavelength of the laser light;
    monitoring the amplitude of the filtered light;
    transmitting a calibration beam from outside a housing of the laser through a window of the housing and through the filter; and
    monitoring the filtered calibration beam.

14. The method of claim 13, further comprising
    reflecting a portion of the calibration beam through the filter, and back out through the window; and
    using the reflected portion of the calibration beam to determine a characteristic of the filter.

15. The method of claim 14, further comprising:
    changing a polarization of the reflected light relative to a polarization of the calibration beam.

16. The method of claim 13, wherein the window is one of the group consisting of a waveguide, a flat optical window, a wedge shaped window, an optical fiber, and a graded index rod.

17. The method of claim 13, wherein the filter has a gain that is a function of a temperature of the laser.

18. The method of claim 13, wherein the filter is one of the group consisting of an etalon and an edge of crossing or edges of band pass filters, low pass filters, or high pass filters.

19. The method of claim 13, further comprising the step of monitoring a light transmitting characteristic of the filter, based on the filtered calibration beam.

* * * * *